United States Patent
Zhu et al.

(10) Patent No.: US 9,082,476 B2
(45) Date of Patent: * Jul. 14, 2015

(54) DATA ACCESSING METHOD TO BOOST PERFORMANCE OF FIR OPERATION ON BALANCED THROUGHPUT DATA-PATH ARCHITECTURE

(71) Applicants: STMicroelectronics (Beijing) R&D Company Ltd., Beijing (CN); STMicroelectronics S.r.l., Agrate Brianza (IT)

(72) Inventors: PengFei Zhu, Bejing (CN); HongXia Sun, Bejing (CN); YongQiang Wu, Bejing (CN); Elio Guidetti, Montano Lucino (IT)

(73) Assignees: STMICROELECTRONICS (BEIJING) R&D COMPANY LTD., Beijing (CN); STMICROELECTRONICS S.R.L., Agrate Brianza (MB) (IT)

( * ) Notice: Subject to any disclaimer, the term of this patent is extended or adjusted under 35 U.S.C. 154(b) by 205 days.

This patent is subject to a terminal disclaimer.

(21) Appl. No.: 13/936,849

(22) Filed: Jul. 8, 2013

(65) Prior Publication Data

US 2014/0019679 A1    Jan. 16, 2014

(30) Foreign Application Priority Data

Jul. 11, 2012    (CN) .......................... 2012 1 0251206

(51) Int. Cl.
*G11C 19/00* (2006.01)
*G06F 9/38* (2006.01)
*G06F 9/30* (2006.01)

(52) U.S. Cl.
CPC .............. *G11C 19/00* (2013.01); *G06F 9/3004* (2013.01); *G06F 9/3012* (2013.01); *G06F 9/3887* (2013.01); *G06F 9/3891* (2013.01)

(58) Field of Classification Search
CPC . G06F 9/3891; G06F 9/3004; G06F 9/30112; G06F 9/3012; G06F 9/3887
USPC .................................. 711/109, 154, 167–169
See application file for complete search history.

(56) References Cited

U.S. PATENT DOCUMENTS

| | | | |
|---|---|---|---|
| 7,036,106 B1* | 4/2006 | Wang et al. | 716/104 |
| 7,302,627 B1* | 11/2007 | Mimar | 714/741 |
| 2004/0133765 A1* | 7/2004 | Tanaka et al. | 712/215 |
| 2005/0204118 A1* | 9/2005 | Jen et al. | 712/225 |
| 2014/0019727 A1* | 1/2014 | Zhu et al. | 712/221 |

* cited by examiner

*Primary Examiner* — Ryan Bertram
(74) *Attorney, Agent, or Firm* — Allen, Dyer, Doppelt, Milbrath & Gilchrist, P.A.

(57) ABSTRACT

An apparatus and method are disclosed to implement digital signal processing operations involving multiply-accumulate (MAC) operations, by using a modified balanced data structure and accessing architecture. This architecture maintains a data-path connecting one address generation unit, one register file and one MAC execution unit. The register file has a hierarchical grouping organization of individual registers, which reduces bubble cycles caused by memory misalignments. This architecture uses parallel execution and can achieve two or more MAC operations per cycle.

21 Claims, 8 Drawing Sheets

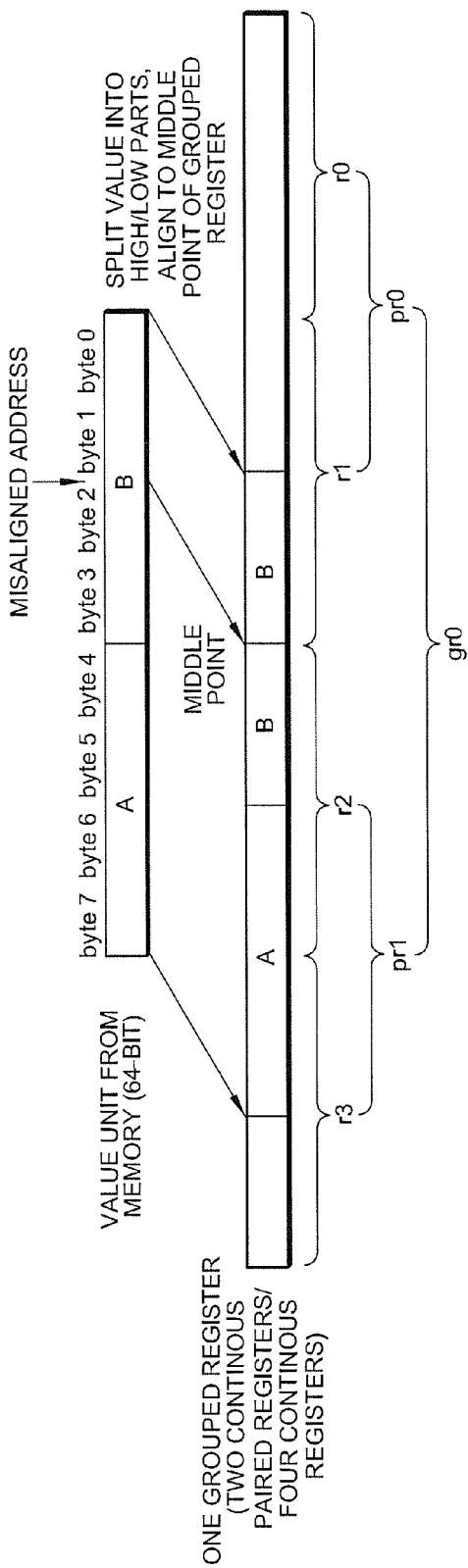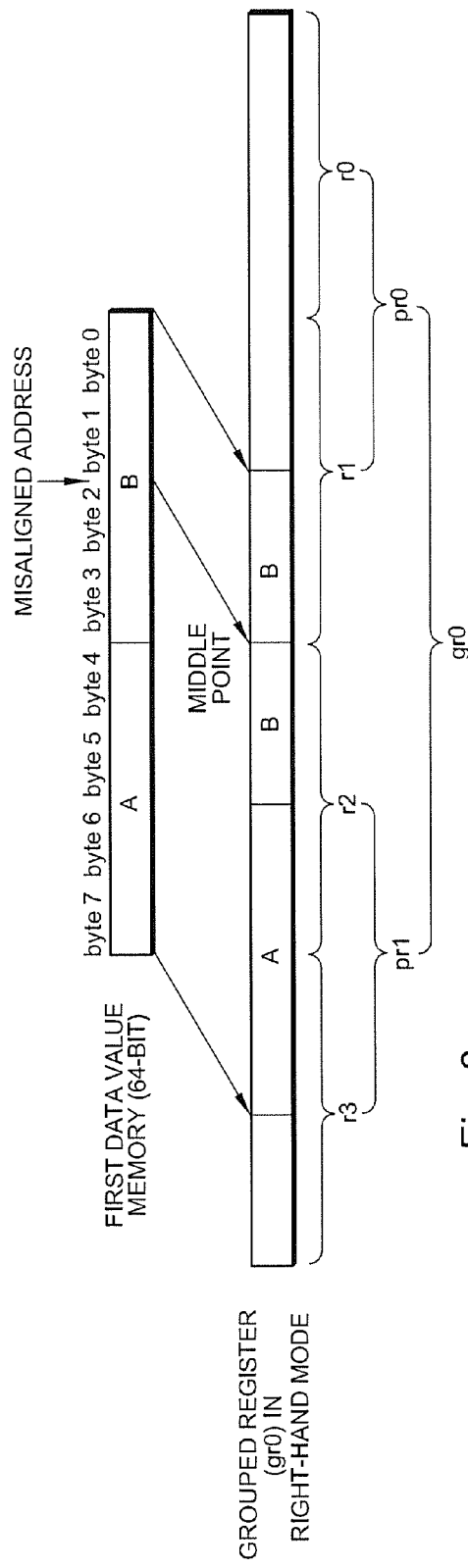

United States Patent

US 9,082,476 B2

DATA ACCESSING METHOD TO BOOST PERFORMANCE OF FIR OPERATION ON BALANCED THROUGHPUT DATA-PATH ARCHITECTURE

RELATED APPLICATION INFORMATION

This application is a translation of and claims the priority benefit of Chinese patent application number 201210251206.2, filed on Jul. 11, 2012, entitled "Novel Data Accessing Method To Boost Performance of FIR Operation on a Balanced Throughput Data-Path Architecture", and is related to application Ser. No. 13/936,886 , "Modified Balanced Throughput Data-Path Architecture for Special Correlation Applications," which are hereby incorporated by reference in their entirety to the maximum extent allowable by law.

FIELD OF THE INVENTION

The invention described herein relates to system architectures, apparatuses and methods for implementing digital signal processing (DSP) operations. More specifically, but not exclusively, it deals with systems, apparatuses, and methods for implementing DSP operations that involve multiply-accumulate (MAC) calculations, such as finite impulse response (FIR) filtering, finite Fourier transforms, convolution, correlation, and others. Other fields of science also use MAC operations, for example, numerical simulations of physical sciences.

BACKGROUND OF THE INVENTION

In the field of signal processing, especially digital signal processing, many of the necessary operations are of the form of a finite impulse response (FIR) filter, also known as a weighted average. In this well-known operation, a finite set of values, called filter coefficients or tap weights, $h(k)$, for $k= 0, \ldots, N-1$, and the values of an input data sequence, $x(k)$, are used to create output sequence values, $y(n)$, by the rule $y(n)=\Sigma_{k=0}^{N-1}h(k)x(n-k)$. Because each time n is incremented by 1, the selected set of input values is shifted by 1; this process is also called a sliding window sum. To calculate each $y(n)$, pairs of coefficients and input values are first multiplied and then added to the sum, a process termed multiply-accumulate (MAC).

FIR operations are used extensively in signal processing to select desired frequencies, remove noise, and detect radar signals, among other applications. As the form of the equation shows, FIR filtering operations are well-suited for implementation on computer hardware. In one such implementation, the filter coefficients are loaded into a dedicated memory array, then for each value $y(n)$, the corresponding portion of the inputs are loaded into a second memory array, and the MAC operation is performed pairwise on the aligned coefficients and inputs.

Though implementing FIR operations can be done on a general purpose computer through software, and often is, many signal processing applications require very fast computations of the FIR operations. These cases often require dedicated implementation on special purpose digital hardware, such as digital signal processors (DSP), or on reconfigurable platforms such as field programmable gate arrays (FPGA), or on application specific integrated circuits (ASIC). At this level, the specific details of hardware implementation, such as how the values are represented and internally stored, and their data type, data bus sizes, etc., become important for obtaining very high speed FIR operations. One goal for efficient hardware implementation is to have a MAC operation occur on every cycle. Achieving even higher MAC rates is especially worthwhile.

A general method and system, known in the art, for achieving fast FIR operations is shown in FIG. 1. Signal data or coefficients are moved from the system's memory through an address generator (AG) and stored in the system's quickly accessible memory locations, called the register file (Reg File). On each cycle, two values are moved from the Reg File into the MAC unit and their product calculated, summed into the accumulated value and written back into the accumulation register location.

For normal ongoing operation there must be a balance between the amount of data being read into the register file as is consumed by the MAC unit. Further, data values going into the MAC must be complete; if there is a delay accessing a data value necessary for the MAC, then the MAC must wait a cycle (or more) until it obtains a complete data value for the multiply and accumulate calculation. Such a pause is called a bubble cycle. It represents an inefficiency in the overall operation of the system. Preventing such inefficiency is an overall goal of the present invention. Another goal of the present invention is to achieve a rate of more than one MAC operation per cycle.

SUMMARY OF THE INVENTION

The embodiments of the invention disclosed herein implement a new form of a balanced throughput data-path architecture, which can overcome the problem of data memory misalignment, and which may be generalized to produce implementations of more than one MAC operation per cycle. The new architecture is shown in FIG. 3. Data, comprising inputs and coefficients for the MAC operation, is stored in the system's large memory storage, which is often random access memory, and is herein called system memory. As various values from system memory are needed for FIR calculations, the AG moves the values from system memory into the architecture's register memory file system, comprising memory cells more quickly accessible to the MAC execution unit.

One element of an exemplary embodiment of the invention is the use of a hierarchical structure for the register memory file system. This feature, called the Grouped Register File (GRF) system, organizes the registers into three levels. The first level is the base level of individual register locations. The second level organizes the registers into pairs of registers. The third level organizes the paired registers into grouped registers, each group register comprising two paired registers and thus four individual registers.

The GRF system's hierarchy and referencing scheme is used by the embodiment's next feature, the misaligned address placement (MAP) system, which is implemented by a modified version of the Address Generation (AG) Unit. The modified AG loads values from system memory into the registers, by two specific processes detailed below, in order to completely fill each single grouped register. Further, the specific loading order helps the overall system implement one MAC, or more, per cycle.

A third feature of the exemplary embodiment is the use of parallel processing in the MAC execution unit. Since the operation to be performed on multiple pairs of data is multiply-accumulate, it is advantageous for the MAC to be structured to receive many pairs of data and coefficients and to perform the operations simultaneously on each cycle. The term used for this form of processing is single-instruction, multiple data (SIMD). The MAC execution unit, regardless of the amount of parallelism it employs, after the multiply-accumulate process, writes back to the register memory system the value of the MAC operation(s).

As will be detailed below, the combination of these features of the invention allows the system throughput—to and from registers and memory—to stay in balance. Further, bubble cycles due to memory misalignment can be overcome by use of the MAP, and the modified AG. Finally, higher MAC rates can be achieved.

The foregoing and other features, utilities and advantages of the invention will be apparent from the following more particular description of an embodiment of the invention as illustrated in the accompanying drawings.

BRIEF DESCRIPTION OF THE DRAWINGS

The detailed description references the accompanying figures. In the figures, the digit(s) to the left of the two right-most digits of a reference number identifies the figure in which that reference number first appears. The same numbers are used throughout the drawings to reference like features and components.

FIG. 7 shows one grouped register (four total registers), and a misaligned address placement of a value from memory, with the misalignment address being aligned to the middle of the grouped register (between paired registers pr1 and pr0).

FIG. 8 shows one step of an exemplary continuous data loading operation of data values A and B from memory into a grouped register g0 (four total registers), using the right-hand mode of grouping and misaligned address placement process.

DETAILED DESCRIPTION

The commonly used acronyms are listed here:
AG Address Generator
ASIC Application Specific Integrated Circuit
DSP Digital Signal Processor (or Processing)
EX Execution Unit
FIR Finite Impulse Response
FPGA Field Programmable Gate Array
GR Grouped Register
MAC Multiply-accumulate
MAP Misplaced Address System
PR Paired Register
RAM Random Access Memory
SIMD Single Instruction, Multiple Data In the present document, the word "exemplary" is used to mean "serving as an example, instance or illustration, and is not construed as limiting." Any embodiment or implementation of the present subject matter described herein as "exemplary" is not necessarily to be construed as preferred or advantageous over other embodiments.

It is well known that many operations of digital signal processing, in particular, FIR filters, use a sliding window type of operation, in which an output set of values is created from an input set by shifted sums of pairwise multiplications of input values with coefficients, or tap weights. For example, a FIR filter has the form $y(n)=\Sigma_{k=0}^{N-1} h(k)x(n-k)$, and the finite Fourier transform is $$A[n] = \sum_{k=0}^{N-1} \alpha[k] W_N^{nk}$$

for $$W_N = \text{Exp}\left[-\frac{2\pi i}{N}\right].$$

For applications that demand fast calculation of such formulas, it is clear that the operation of multiply and accumulate must be performed rapidly. The invention herein discloses various embodiments for the fast implementation of such MAC operations.

Figure 1:
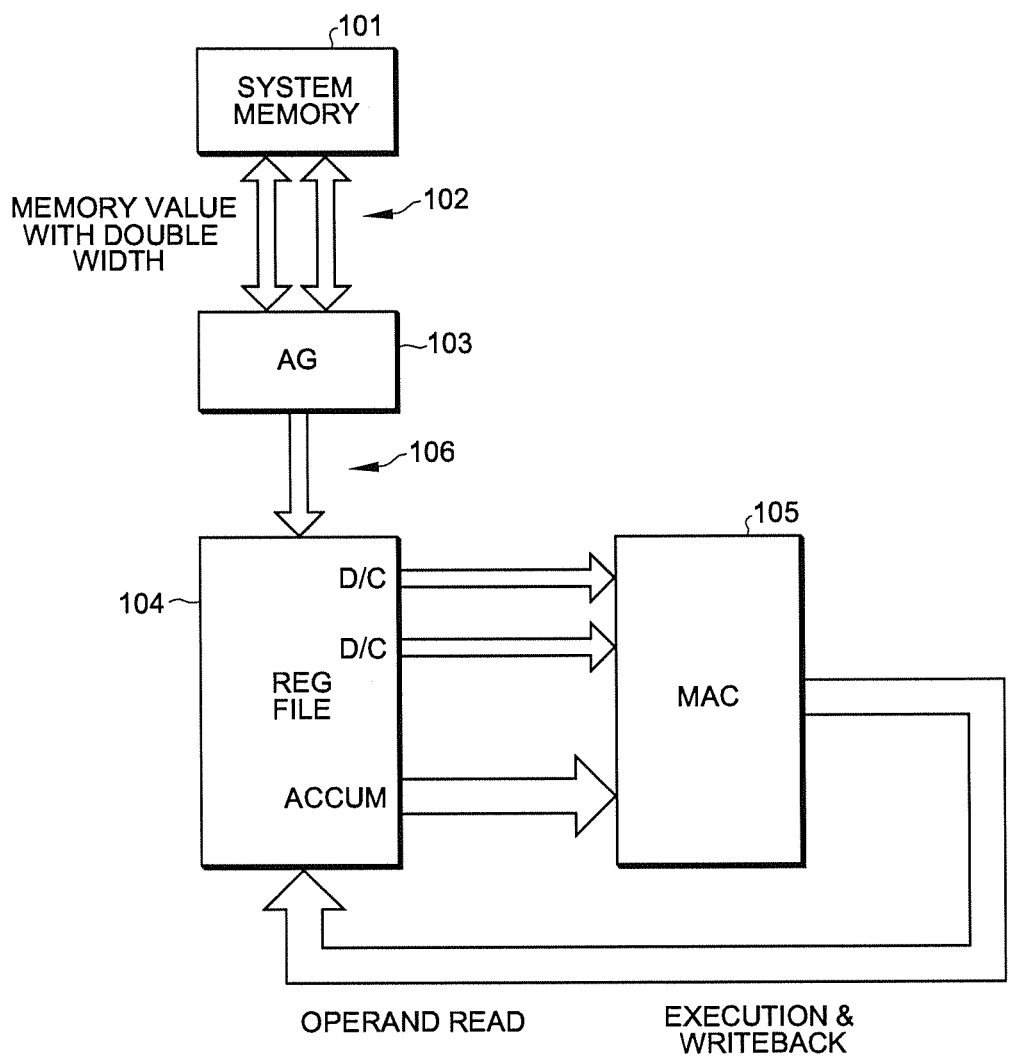
FIG. 1 shows a current art balanced throughput data-path architecture.

One known architecture for implementing FIR filtering in digital circuitry is shown in FIG. 1, and called a balanced throughput data-path architecture. It can be implemented on special purpose DSP chips, FPGAs, or ASICs. It comprises four principle elements: a large system memory 101, an address generator AG 103, a register file 104 (Reg File), and a MAC execution unit 105. The system memory is often comprised of random access memory, and is used to store large amounts of the input and output data values, and if necessary the filter coefficients for a FIR application. The Reg File unit comprises an array of memory locations called registers which are typically faster for the processing parts of the system to access. The AG is the addressing system, often implemented in circuitry, responsible for moving desired pieces of the data between the system memory and the Reg File. The AG receives and writes values to the system memory over the data bus 102. Finally, the MAC unit 105 comprises the necessary circuitry for multiplying two values and adding that product to an accumulation value. The accumulation value, Accum, may be larger in byte size than the size of the data or coefficients D/C while stored in the Reg File, in order to prevent problems of arithmetic overflow. As is known in the art, MAC units now have the capability of executing a MAC operation in one cycle.

Under ideal operating conditions in which the goal is to obtain 1 MAC operation to occur in each cycle, the system must move the same amount of data from the system memory into the Reg File as it moves from the Reg File into the MAC, and back to the accumulation register location. This is the balancing of data throughput that is needed to prevent overflow of the Reg File, and to ensure the MAC execution unit is fully utilized.

In this known architecture, the Reg File may have a three-read/two-write port structure, so that on each cycle two data and/or coefficient values, D/C in FIG. 1, together with the current value of the of the accumulation, is moved from the Reg File into the MAC unit for a MAC operation. Simultaneously, two new data or coefficient values are moved by the AG from the system memory over one write port 106 into the Reg File, and at the end of the MAC operation, the updated accumulation value is moved by the MAC execution unit back into the Reg File location where it originated over the other write port of the Reg File.

For this architecture to work ideally, the two new data or coefficient values that are to be accessed from system memory must be moved in one cycle from system memory. Further, the data memory addresses used by the AG must align with the memory blocks of the memory, so that two data values can be moved in one cycle over the data bus.

However, if the memory address of a complete pair of coefficients and/or data values is not aligned with the blocks of the system memory, i.e. the address points to a byte between boundaries of an access block of system memory, then in one cycle only part of the needed pair can be moved over the bus, and the system would need to wait to the next cycle to complete the data move. This is called memory misalignment; it requires a bubble cycle in the MAC unit so that the complete pair of values can be moved into the Reg File locations.

Figure 2:
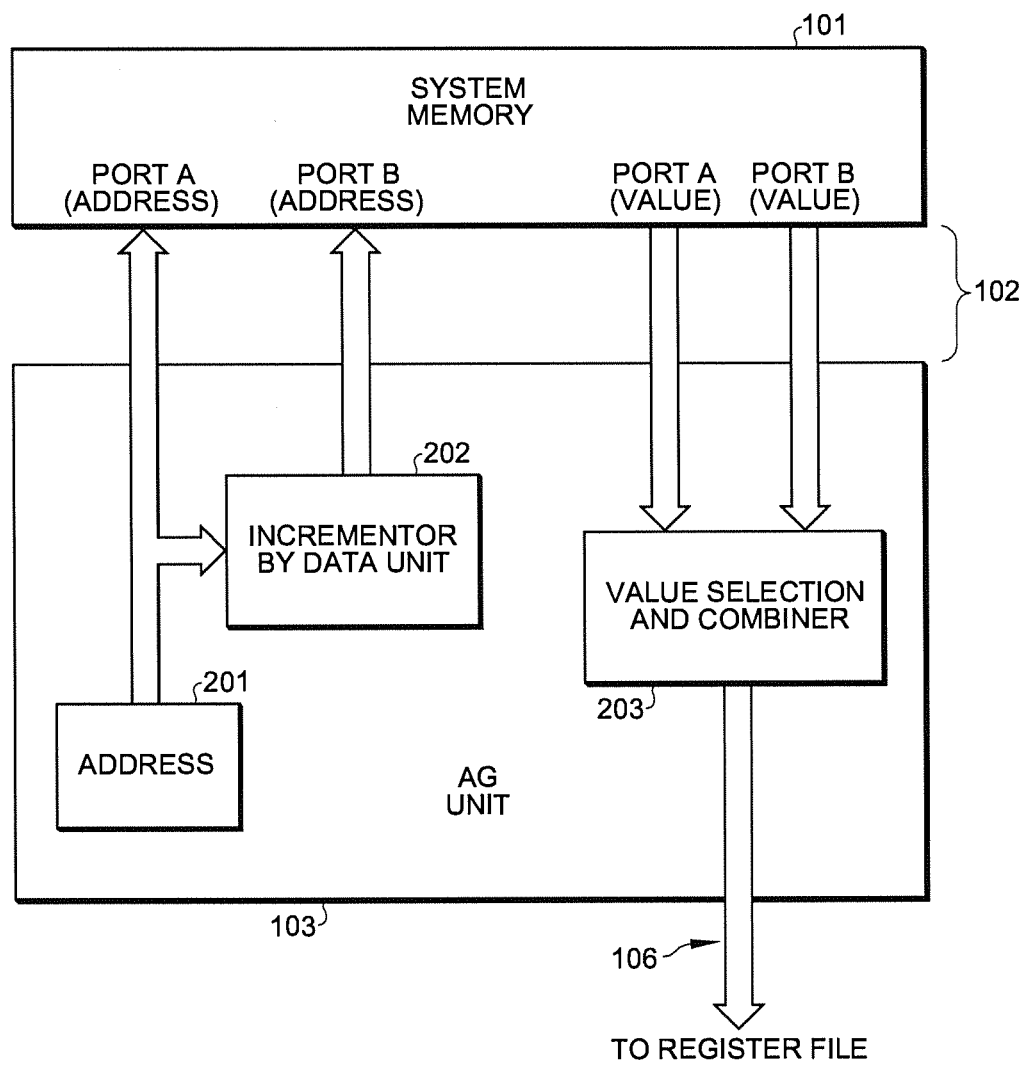
FIG. 2 shows the internal details of the current art address generator (AG) and how it accesses the memory.

One known way to handle memory misalignment is to double the AG, and to have the system memory have both dual address ports and dual value output ports. This is shown in FIG. 2. In the case that data and/or coefficient values are stored across a memory block boundary, then to access it, the AG will need to generate two addresses, the start 201, and the incremented address generated by an Incrementor unit 202. But this would require two address ports be available on the system memory. Also, the system memory would need two ports by which to export memory blocks containing the values. Within the AG, the selector and combiner unit 203 would assemble the data value and move it to the Reg File. While functional, this approach requires more circuit area and power for implementation in digital hardware.

Figure 3:
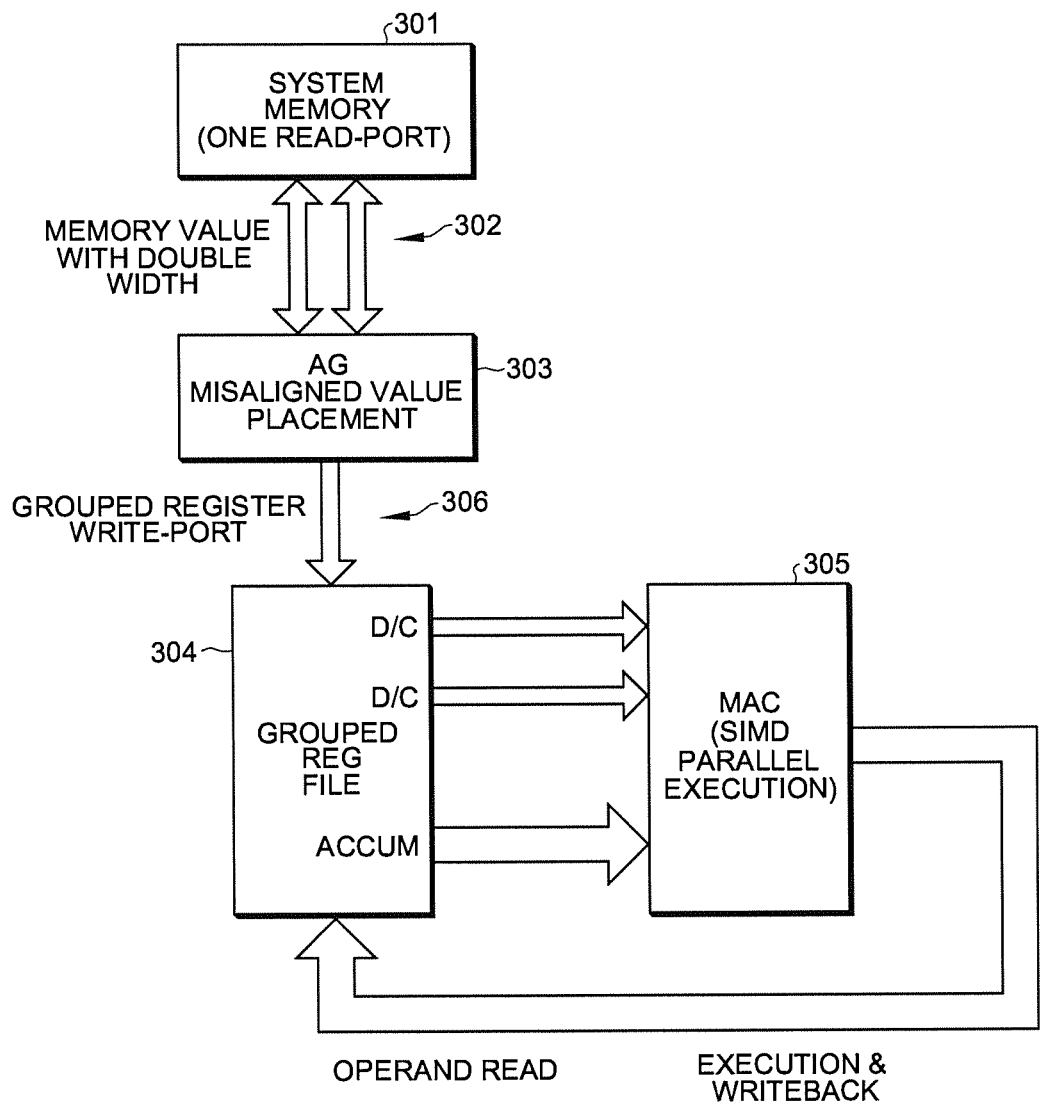
FIG. 3 shows the invention's modification of the current art balanced throughput data-path architecture.
Figure 4:
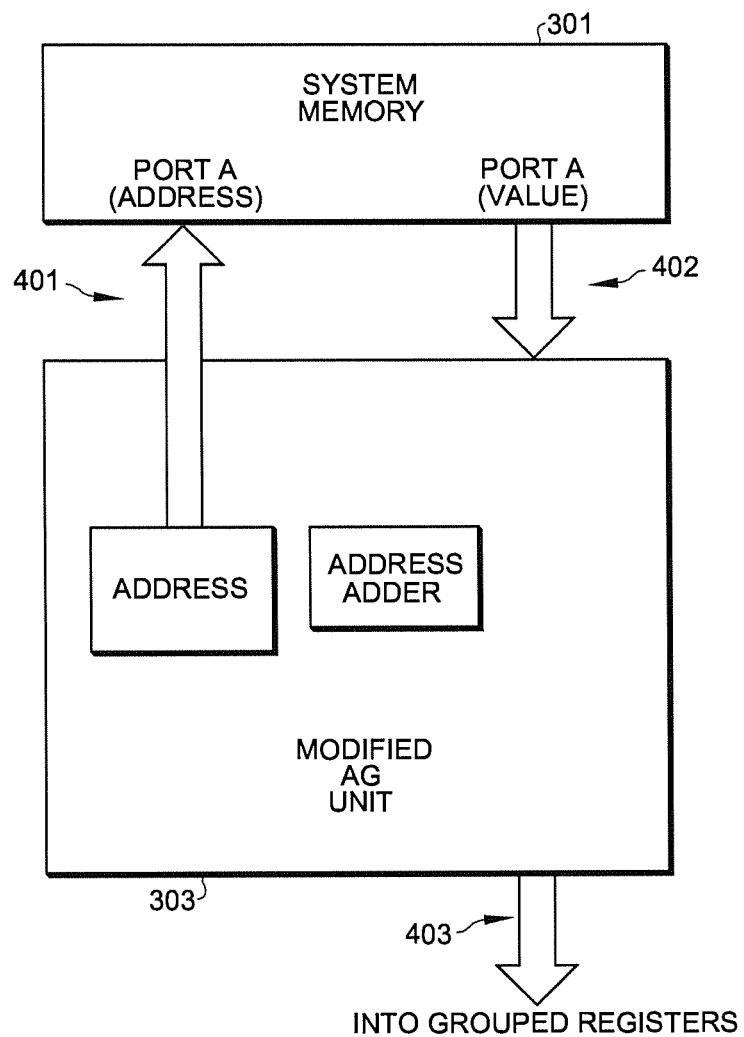
FIG. 4 shows a modified form for the AG in the invention.

One embodiment of the current invention, shown in FIG. 3, discloses a different architecture for achieving balanced data throughput, which can reduce or eliminate the occurrence of bubble cycles, which does not need extra ports on the system memory, and which can be extended to achieve more than one MAC operations in a clock cycle. The embodiment comprises a main system memory 301, typically comprised of RAM, which is accessed by a modified address generator AG 303 to move values, either signal data values or coefficients, to and from a register memory array system. The AG may be implemented with only one address adder. The register memory array is organized as a GRF 304, which is directly accessed, and written to, by a multiply-accumulate processor (MAC) 305. The memory data bus 302 may be double width, or in other cases quad width, or any positive power of 2 width, wherein width refers here to the size, in bytes, of each register memory location.

One of the differences from the prior art is that in one embodiment the MAC unit is able to perform more than one pair of MAC operations in one cycle by using a single instruction, multiple data process (SIMD).

Figure 5:
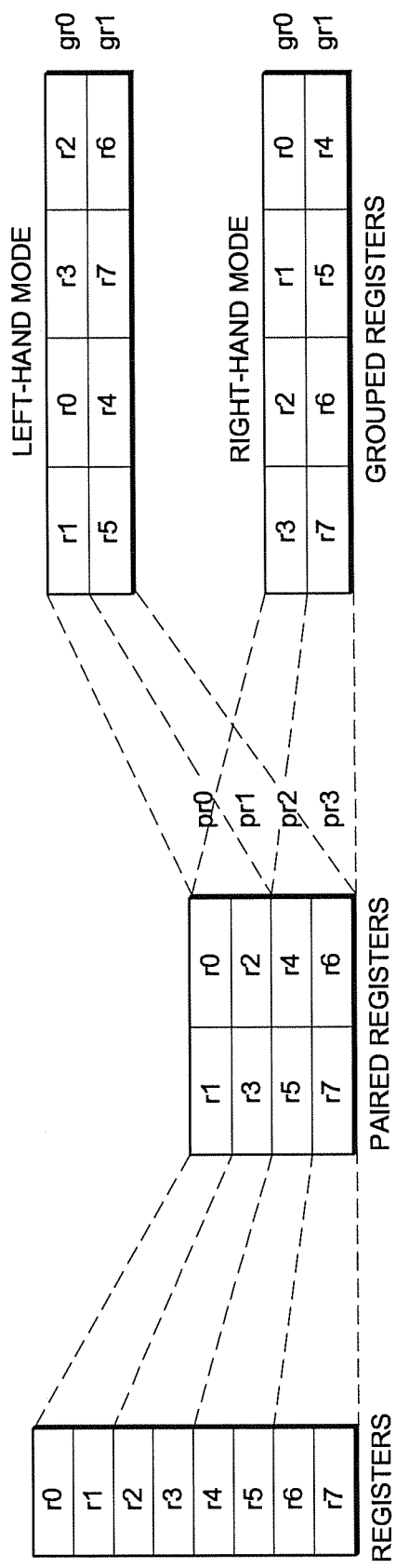
FIG. 5 shows a grouped register file organization scheme of the present invention.

Also, the GRF for the register memory array 304 uses a hierarchical organization scheme for the individual register memory locations. In one embodiment this is a three-layer data addressing and accessing scheme, comprising the base layer of the individual registers, a second layer in which pairs of individual register memory locations are combined for use as a unit, called a paired register (PR), and in which two PRs are combined for use as a unit, called a grouped register (GR). FIG. 5 shows, from left to right, an example in which eight registers have individual addresses, labeled schematically as r0 through r7, how pairs of these registers are combined into four PRs, labeled schematically p0 through p3, and finally how—by alternate modes—these four PRs are grouped into two Group Registers (GR), labeled schematically g0 and g1. The embodiment illustrated in FIG. 5 shows that the PRs have the odd indexed registers to the left, with the even indexed registers to the right.

There are two modes of organization of the PRs into GRs. In the left-hand mode, the even indexed PR is placed to the left, with the odd indexed PR to the right. In the right-hand mode the odd indexed PR is placed to the left with the even indexed PR to the right.

With this hierarchical register organization scheme, in one embodiment, the modified AG 303 moves values to and from the system memory using a misaligned address placement process (MAP).

As an exemplary case of the operation of the MAP by the modified AG with the GRF system, assume that register memory location width is 32 bits, i.e. 4 bytes. Also assume that the AG accesses a double width block of 64 bits, i.e. 8 bytes, from system memory over a double width data bus. A system memory address provided to the AG is aligned when that address is a multiple of 4. For addresses provided in binary, an aligned address has the two least significant figures equal to 0 each.

Figure 6:
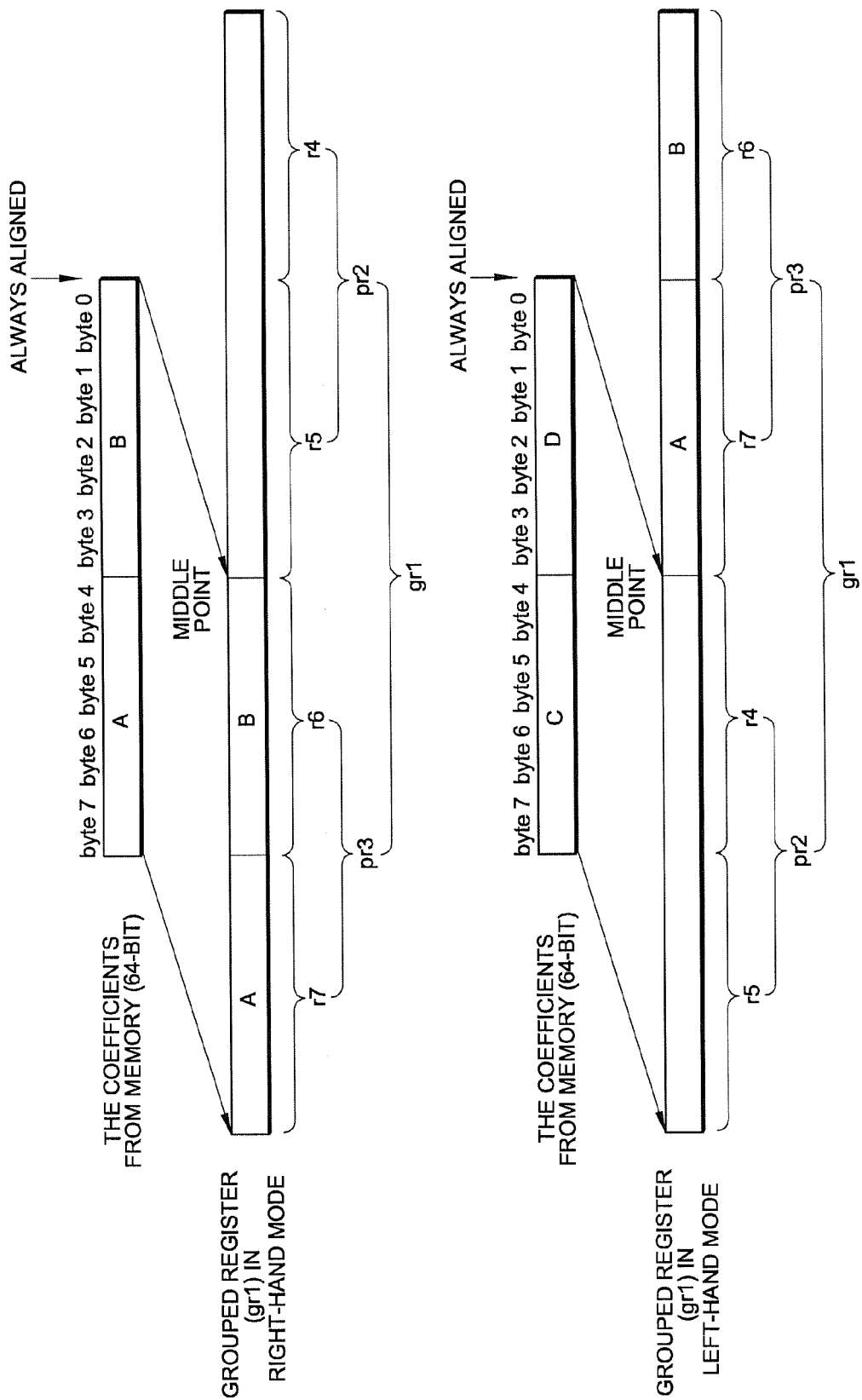
FIG. 6 shows a two-stage process to load data into a grouped register, under aligned memory placement.

If no memory address misalignment is detected in the instruction, the values from system memory can be stored in one PR, of one GR. A second data block from system memory could then be stored in the other PR of the GR. This is illustrated in FIG. 6.

However, if a memory address misalignment is detected, in this example when the address provided to the AG is not a multiple of 4, the exemplary embodiment of the invention first creates an aligned address by forcing the appropriate number of least significant bits in the address to be 0. The double width of 8 bytes of values to be loaded is determined from the aligned address. Further, the AG assigns an alignment point based on the address's misalignment pattern. As an example, if the address's misalignment is at byte 2 (of 0 to 7), the alignment point is the point between byte 1 and byte 2 of the block of data being moved. The alignment point is aligned with the midpoint of the target group register, so that bytes 0 and 1 are schematically aligned to the right of the GR's midpoint, and bytes 2 through 7 are schematically aligned to the left of the midpoint, as shown in FIG. 7. Then the data bytes are loaded into the target GR as shown. Note only two of the four available bytes in each of registers r1 and r3 is filled. Note that in FIG. 5 the GR, labeled g0, uses the right-hand mode of the GRF system.

Figure 9:
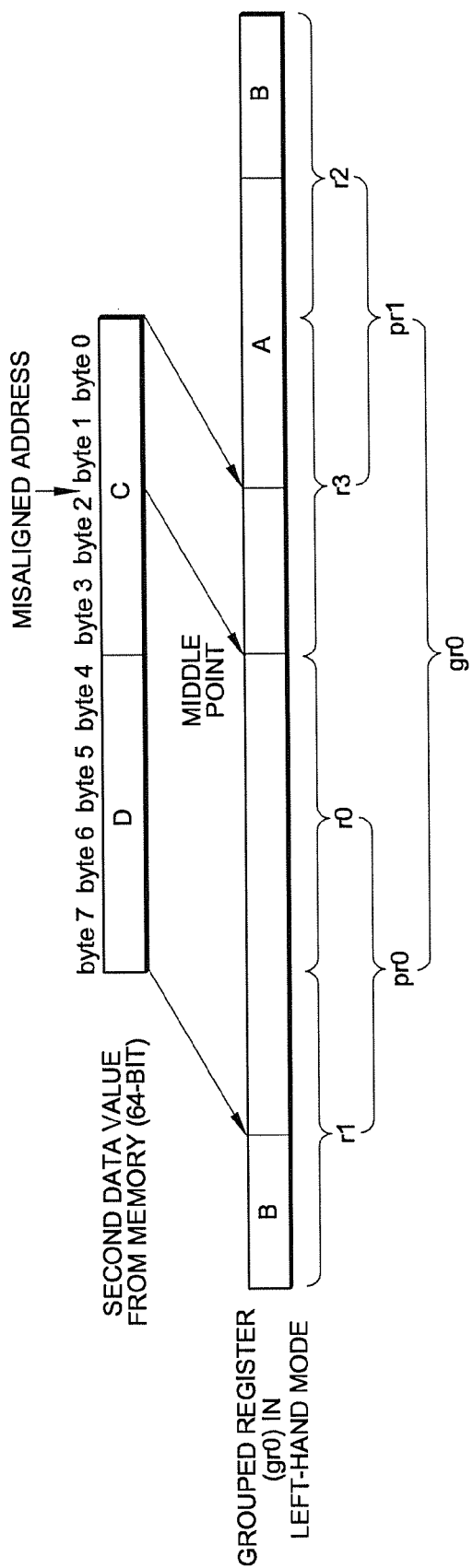
FIG. 9 shows a second step of the exemplary continuous data loading operation, now of data values C and D, from memory into the same grouped register g0, using the left-hand mode of grouping and misaligned address placement.

For a continuous loading operation, if the exemplary right-hand mode loading operation of the previous paragraph has been used for one loading operation, then on the next iteration, the next block of 8 bytes loaded uses a left-hand mode, with the same GR, as shown in FIGS. 8 and 9. FIG. 8 shows the same right-hand mode process illustrated in FIG. 5. FIG. 7 shows how the use of the left-hand mode of accessing the registers in gr0 allows the next 8 bytes, C and D, to be loaded into the remaining sections of gr0.

Because with the MAP both values to be multiplied have been moved into the register array locations, the MAC execution unit can access both values and the accumulation value, perform the multiply-accumulate operation and write back the updated accumulation value in one cycle.

The embodiments of the architecture can achieve more than one MAC operation per cycle, when the data path 302 is more than double width, to load pairs of both coefficients and/or data values, and the MAC unit is structured for single-instruction, multiple data (SIMD) operation. One exemplary way to structure the MAC unit to be configured for a positive integer K number of MAC operations per cycle; wherein the size of the data values to be multiplied is positive power of 2, M; and wherein the data path from the memory storage unit to the register memory array 2*M*K.

A presently preferred embodiment of the present invention and many of its improvements have been described with a degree of particularity. It should be understood that this description has been made by way of example, and that the invention is defined by the scope of the following claims. Other embodiments within the scope of the claims are obvious to one of ordinary skill in the arts.

We claim:

1. An apparatus for performing signal processing operations comprising:
   a system memory storage unit;
   an Address Generator (AG) unit functionally connected to the system memory storage unit and operable to receive data from, and write data to, the system memory storage unit over a data bus that has a plurality of data widths;
   a register memory array functionally connected to the AG unit and operable to receive data from, and write data to, the AG unit, wherein the data in the register memory array is stored using a register file system;
   a multiply-accumulate (MAC) execution unit functionally connected to the register file system and operable to receive data from and write data to the register memory array, and which multiplies and adds pairs of data values and writes the sum to a location in the register memory array;
   wherein the register file system is organized in a hierarchical scheme for the individual register memory locations, in which pairs of individual register memory locations are organized into respective paired register (PR) units, and pairs of PR units are organized into respective group register (GR) units; and
   wherein the AG unit uses a misaligned address placement (MAP) system to place data from the system memory storage unit into the register file system by aligning any misaligned address with a middle point of a group register unit.

2. The apparatus of claim 1 wherein a plurality of widths of the data bus from the system memory storage unit to the AG unit is a positive power of 2 of a size in bytes of an individual register memory location.

3. The apparatus of claim 1 wherein the AG unit has one address adder.

4. The apparatus of claim 1 wherein the AG unit accesses the system memory storage unit through a single port.

5. The apparatus of claim 1 wherein the hierarchical organization scheme organizes eight register locations into two GR units according to either a left-hand mode or a right-hand mode; wherein the left-hand mode arranges registers r0 through r3 into GR0 in the order [r1, r0, r3, r2] and the registers r4 through r7 into GR1 in the order [r5, r4, r7, r6]; and wherein the right-hand mode arranges registers r0 through r4 into GR0 in the order [r3, r2, r1, r0] and the registers r5 through r7 into GR1 in the order [r7, r6, r5, r4].

6. The apparatus of claim 5 wherein the AG unit moves data into the GR units by moving a block of data that is double a size in bytes of a standard register's size in bytes, wherein the AG unit determines an alignment point for the bytes of the data block being moved from system memory storage unit, the AG unit aligning said alignment point with the middle point of a GR unit into which the AG unit is to move the data, and the data is correspondingly loaded byte-wise into said group GR unit.

7. The apparatus of claim 6 wherein for the case of a memory aligned address, the alignment point of the data block being moved from system memory storage unit is the end of byte 0 opposite of the end of byte 0 that is adjacent to byte 1.

8. The apparatus of claim 6 wherein for the case of a memory misaligned address, the alignment point of the data block being moved from system memory storage unit is at the end of the byte number of the misaligned address adjacent to the next lower byte number, and wherein the AG accesses the system memory storage unit by forcing the misaligned address to be aligned to a memory block.

9. The apparatus of claim 6 wherein the AG unit moves two blocks of data, each of a size in bytes double that of a standard register's size in bytes, by loading the first block first with the GR unit configured in the left-hand ordering, and the second block of data in the right-hand ordering.

10. The apparatus of claim 6 wherein the AG unit sequentially moves a plurality of pairs of blocks of data into corresponding GR units, two blocks of data to one GR unit, by determining the corresponding alignment point for each pair of data blocks.

11. The apparatus of claim 1 wherein the MAC execution unit is configured for single-instruction, multiple data (SIMD) operation.

12. The apparatus of claim 1 wherein the MAC execution unit is configured for a positive integer K a plurality of MAC operations per cycle; wherein a size of the data values to be multiplied is a positive power of 2, M; and wherein the data path from the system memory storage unit to the register memory array is $2*M*K$.

13. A method for performing data processing operations comprising:
   reading from, and writing to, a system memory storage unit a plurality of values to be used in a multiply-accumulate (MAC) operation;
   storing the values in register memory locations organized by using both a three-tier hierarchical access system and a misaligned address placement process;
   moving values from the register memory locations into a MAC execution unit;
   performing the MAC operation; and
   writing the result of the operation into a register;
   wherein the three-tier hierarchical access scheme organizes pairs of individual register memory locations into paired register (PR) units, and organizes pairs of PR units into group register (GR) units.

14. The method of claim 13 wherein the plurality of data values read from the system memory storage unit is moved across a data bus by an Address Generator (AG) unit, and wherein data bus size is a positive power of 2 of width of the register memory data size.

15. The method of claim 13 wherein the three-tier hierarchical organization scheme organizes eight register locations into two GR units according to either a left-hand mode or a right-hand mode;
   wherein the left-hand mode arranges registers r0 through r3 into GR0 in the order [r1, r0, r3, r2] and the registers r4 through r7 into GR1 in the order [r5, r4, r7, r6]; and
   wherein the right-hand mode arranges registers r0 through r4 into GR0 in the order [r3, r2, r1, r0] and the registers r5 through r7 into GR1 in the order [r7, r6, r5, r4].

16. The method of claim 14 wherein the AG unit moves data from system memory storage unit into the GR units by moving a block of data that is double the size in bytes of a standard register's size in bytes, by the AG unit determining an alignment point of the bytes being moved from system memory storage unit, by the AG aligning said alignment point with the middle point of a GR unit into which the AG unit is to move the data, and by the data being correspondingly loaded byte-wise into said group register unit.

17. The method of claim 16 wherein for the case of a memory aligned address, the alignment point of the data block being moved from system memory storage unit is the end of byte 0 opposite of the end of byte 0 that is adjacent to byte 1.

18. The method of claim 16 wherein for the case of a memory misaligned address, the alignment point of the data block being moved from system memory storage unit is at the end of the byte number of the misaligned address adjacent to the next lower byte number, and wherein the memory unit is accessed by forcing the misaligned address to be aligned to a memory block.

19. The method of claim 18 wherein the AG unit moves two blocks of data, each of size in bytes double the size of a standard register's size in bytes, by the loading the first block with the group register configured in the left-hand ordering, and the second block of data in the right-hand ordering.

20. The method of claim 16 wherein the AG unit sequentially moves a plurality of pairs of blocks of data into corresponding GR units, two blocks of data to one GR unit, by determining the appropriate alignment point for each pair of data blocks.

21. The method of claim 13 wherein the MAC execution unit operates by performing positive integer K SIMD operations per cycle; wherein the size of the data values to be multiplied is a positive power of 2, M; and wherein the data path from the system memory storage unit to the register memory array is $2*M*K$.

\* \* \* \* \*

UNITED STATES PATENT AND TRADEMARK OFFICE
CERTIFICATE OF CORRECTION

PATENT NO. : 9,082,476 B2  
APPLICATION NO. : 13/936849  
DATED : July 14, 2015  
INVENTOR(S) : PengFei Zhu et al.

Page 1 of 1

It is certified that error appears in the above-identified patent and that said Letters Patent is hereby corrected as shown below:

In the Claims

Column 7, Line 62, Claim 6    Delete: "group"

Signed and Sealed this
Seventeenth Day of November, 2015

Michelle K. Lee
*Director of the United States Patent and Trademark Office*